United States Patent
Xu et al.

(10) Patent No.: US 11,765,314 B2
(45) Date of Patent: Sep. 19, 2023

(54) TELEVISION, TELEVISION CONTROL METHOD, AND CONTROL APPARATUS

(71) Applicant: SHENZHEN SKYWORTH-RGB ELECTRONIC CO., LTD., Shenzhen (CN)

(72) Inventors: Zhengxin Xu, Shenzhen (CN); Tiejun Lu, Shenzhen (CN); Wenxing Yao, Shenzhen (CN)

(73) Assignee: SHENZHEN SKYWORTH-RGB ELECTRONIC CO., LTD., Shenzhen (CN)

( * ) Notice: Subject to any disclaimer, the term of this patent is extended or adjusted under 35 U.S.C. 154(b) by 134 days.

(21) Appl. No.: 17/508,778

(22) Filed: Oct. 22, 2021

(65) Prior Publication Data

US 2022/0046203 A1    Feb. 10, 2022

Related U.S. Application Data

(63) Continuation of application No. PCT/CN2020/113858, filed on Sep. 8, 2020.

(30) Foreign Application Priority Data

Oct. 12, 2019 (CN) .......................... 201910968187.7

(51) Int. Cl.
*H04N 5/64* (2006.01)
*H04N 21/443* (2011.01)
(Continued)

(52) U.S. Cl.
CPC .............. *H04N 5/64* (2013.01); *G06F 13/409* (2013.01); *G06F 13/4063* (2013.01); *H04N 21/4436* (2013.01); *H05K 7/1468* (2013.01)

(58) Field of Classification Search
CPC .. H04N 5/64; H04N 21/4436; G06F 13/4063; G06F 13/409; H05K 7/1468
See application file for complete search history.

(56) References Cited

U.S. PATENT DOCUMENTS

| 8,376,103 B1 * | 2/2013 | Sliger | A61B 8/4444 |
| | | | 191/12.4 |
| 2006/0197755 A1 * | 9/2006 | Bawany | G06F 1/266 |
| | | | 345/179 |

(Continued)

FOREIGN PATENT DOCUMENTS

| CN | 200944443 Y | 9/2007 |
| CN | 200956129 Y | 10/2007 |

(Continued)

OTHER PUBLICATIONS

First Office Action issued in counterpart Chinese Patent Application No. 201910968187.7, dated Mar. 25, 2021.

(Continued)

*Primary Examiner* — Phong H Dang
(74) *Attorney, Agent, or Firm* — Westbridge IP LLC

(57) ABSTRACT

Disclosed is a television including a display body and an interface extension apparatus. The display body includes a shell and a main board provided with a first interface and installed in the shell. The shell is provided with a channel opening. The interface extension apparatus includes a driving module and an interface extension line including a data line and a second interface. The data line is connected between the first interface and the second interface. The driving module is in transmission connection with the data line. The driving module is for driving one end of the interface extension line provided with the second interface to out of the shell through the channel opening, and driving the interface extension line out of the shell to be retracted (Continued)

into the shell through the channel opening. The application also discloses a television control method and a control apparatus.

12 Claims, 6 Drawing Sheets

(51) Int. Cl.
*G06F 13/40* (2006.01)
*H05K 7/14* (2006.01)

(56) References Cited

U.S. PATENT DOCUMENTS

| | | | |
|---|---|---|---|
| 2007/0075680 A1* | 4/2007 | Chung | H02J 7/0068 |
| | | | 320/125 |
| 2008/0248688 A1 | 10/2008 | Amidon | |
| 2011/0242027 A1 | 10/2011 | Chang | |
| 2015/0077765 A1* | 3/2015 | Pettersson | G01B 11/043 |
| | | | 356/634 |
| 2018/0189217 A1* | 7/2018 | Davuluri | G06F 13/4068 |
| 2019/0050037 A1* | 2/2019 | Wang | G06F 13/4282 |

FOREIGN PATENT DOCUMENTS

| | | |
|---|---|---|
| CN | 101739102 A | 6/2010 |
| CN | 201812920 U | 4/2011 |
| CN | 206195090 U | 5/2017 |
| CN | 207398529 U | 5/2018 |
| CN | 108923203 A | 11/2018 |
| CN | 208401214 U | 1/2019 |
| CN | 110730319 A | 1/2020 |
| EP | 3285483 A1 | 2/2018 |
| EP | 3457248 A1 | 3/2019 |

OTHER PUBLICATIONS

International Search Report and Written Opinion issued in corresponding PCT Application No. PCT/CN2020/113858, dated Dec. 8, 2020.
Second Office Action issued in counterpart Chinese Patent Application No. 201910968187.7, dated Sep. 18, 2021.
Examination Report issued in counterpart Indian Patent Application No. 202127057584, dated Jun. 10, 2022.
Supplementary European Search Report issued in counterpart European Patent Application No. 20873824.5, dated Dec. 13, 2022.

* cited by examiner

TELEVISION, TELEVISION CONTROL METHOD, AND CONTROL APPARATUS

CROSS-REFERENCE TO RELATED APPLICATIONS

The present disclosure is a continuation application of International Application No. PCT/CN2020/113858, filed on Sep. 8, 2020, entitled "Television, Television Control Method, and Control Apparatus" which claims the priority of Chinese Patent Application No. 201910968187.7, filed on Oct. 12, 2019. The disclosures of the aforementioned applications are hereby incorporated by reference in their entireties.

TECHNICAL FIELD

The application relates to the technical field of television, in particular to a television with extension line, a television control method and a control apparatus.

BACKGROUND

Most televisions are equipped with interfaces connected with external apparatus to realize various functions of televisions. Nowadays, televisions are generally fixedly provided with an interface connected with an external apparatus on a back of a shell, and the interface is connected with the main board through an internal line to realize corresponding functions.

However, since the back of the shell of the television is mostly arranged to be close to a wall, the space is limited, so it is inconvenient for a hand to reach and plug-in an apparatus, and many large and heavy apparatuses need external wires to realize the connection between the apparatuses and the television. However, this requires users to configure corresponding wires separately, and the wires need extra storage space and management, which leads to inconvenience for the users to use the interface of the television.

The above content is only used to assist in understanding the technical proposal of the present application, and is not intended to acknowledge that the above content is a prior art.

SUMMARY

The main purpose of the application is to provide a television control method, aiming at simplifying user operation and improving the convenience of using a television interface by the user.

To achieve the above purpose, the application provides a television including:
  a display body including a shell and a main board, where the main board is provided with a first interface, the main board is installed in the shell, and the shell is provided with a channel opening;
  an interface extension apparatus installed in the shell, including a driving module and an interface extension line, where the interface extension line includes a data line and a second interface, one end of the data line is connected with the first interface, and another end of the data line is connected with the second interface;
  In particular the driving module is connected with the data line in a transmission way, the driving module is configured for driving one end of the interface extension line provided with the second interface to protrude out of the shell through the channel opening, and driving the interface extension line out of the shell to be retracted into the shell through the channel opening.

In one embodiment, the main board has a plurality of different types of first interfaces, a number of the interface extension lines and a number of the driving modules are the same as a number of the first interfaces, the interface extension lines are connected with the first interfaces in one-to-one correspondence, the driving modules are arranged in one-to-one correspondence with the interface extension lines, and a type of each second interface is the same as a type of a first interface connected with the second interface.

In one embodiment, the television further includes a line length detection module configured for detecting a first length information of the interface extension line located outside the shell and/or a second length information of the interface extension line located inside the shell;
  the display body is also configured for displaying the first length information and/or the second length information.

In addition, to achieve the above purpose, the present application further provides a television control method based on the television according to any one of the embodiments above, the television control method further includes the following steps;
  acquiring a first control parameter;
  controlling the control driving module to drive one end of the interface extension line provided with the second interface to extend out of the shell through the channel opening, in a determination that the first control parameter includes a first preset instruction.

In one embodiment, when the television includes first interfaces, interface extension lines and driving modules which are correspondingly arranged, before the step of controlling the control driving module to drive one end of the interface extension line provided with the second interface to extend out of the shell through the channel opening, in a determination that the first control parameter includes a first preset instruction, the television control method further includes:
  determining a target interface type according to the first control parameter;
  determining a target driving module among the driving modules according to the target interface type;
  the step of controlling the control driving module to drive one end of the interface extension line provided with the second interface to extend out of the shell includes the following steps:
  controlling the target driving module to drive one end of a corresponding interface extension line provided with a second interface to extend out of the shell through the channel opening.

In one embodiment, after the step of controlling the control driving module to drive one end of the interface extension line provided with the second interface to extend out of the shell through the channel opening, in a determination that the first control parameter includes a first preset instruction, the television control method further includes:
  acquiring a second control parameter;
  controlling the driving module to drive the interface extension line out of the shell to be retracted into the shell through the channel opening, in a determination that the second control parameter includes a second preset instruction.

In one embodiment, the step of controlling the driving module to drive the interface extension line out of the shell to be retracted into the shell through the channel opening includes:

controlling the driving module to drive the second interface of the interface extension line outside the shell to move towards the channel opening, in a determination that the second interface is in a connected state;

acquiring a load torque of the interface extension line out of the outer part of the shell;

controlling the driving module to continue to drive the second interface to move towards the channel opening until the second interface is located at the channel opening, in a determination that the load torque is less than a preset torque; and/or controlling the driving module to stop driving the interface extension line and output a first prompt information, in a determination that the load torque is greater than or equal to the preset torque.

In one embodiment, when the step of controlling the driving module to drive the interface extension line to extend out of the shell through the channel opening is executing, the television control method further includes:

acquiring first length information of the interface extension line located outside the shell and/or second length information of the data line located inside the shell among interface extension lines extending out of the shell;

outputting a second prompt information according to the first length information and/or the second length information.

In one embodiment, after the step of outputting the second prompt information according to the first length information and/or the second length information, the television control method further includes:

acquiring a third control parameter;

controlling the driving module to stop driving the interface extension line, in a determination that the third control parameter includes a third preset instruction.

In one embodiment, after the step of controlling the driving module to drive one end of the interface extension line provided with the second interface to extend out of the shell through the channel opening, the television control method further includes:

acquiring electric quantity information and/or apparatus operation information of the apparatus, in a determination that the second interface is connected with an apparatus;

controlling the television to output the electric quantity information and/or the apparatus operation information; and/or determining whether the apparatus supports fast charging;

controlling the television to enter a first charging mode to charge the apparatus according to a first charging speed, in a determination that the apparatus supports fast charging; or controlling the television to enter a second charging mode to charge the apparatus according to a second charging speed, in a determination that the apparatus does not support fast charging;

wherein the first charging speed is faster than the second charging speed.

In addition, to realize the above purpose, the present application further provides a control apparatus, the control apparatus includes a memory, a processor, and a television control program stored in the memory and operable on the processor, when the television control program is executed by the processor, the steps of the television control method according to any one of the embodiments above are executed.

The application provides a television, which includes a display body and an interface extension apparatus, the display body includes a shell and a main board. The main board is provided with a first interface, the main board is installed in the shell, the shell is provided with a channel opening, the interface extension apparatus is installed in the shell, the interface extension apparatus includes a driving module and an interface extension line, the interface extension line includes a data line and a second interface, one end of the data line is connected with the first interface, and the other end of the data line is connected with the second interface. The driving module is in transmission connection with the data line. The driving module is configured for driving one end of the interface extension line provided with the second interface to extend out of the shell through the channel opening, and driving the interface extension line out of the shell to be retracted to the inside of the shell through the channel opening. As the television has its own interface extension line, when a user needs to use the television interface, the interface is no longer fixed on the television shell. Instead, a second interface is added to connect with an external apparatus through data lines. Users do not need to put their hands into a small space to plug in the apparatus. The interface extension line of the driving module is directly controlled manually or by a control command One end of the drive interface extension line provided with the second interface extends out of the shell. The apparatus is connected to the second interface. When users do not need to use the television interface or do not want the interface extension line to be exposed, the driving module can be controlled to drive the interface extension line to be retracted in the shell, which is convenient for the users to store and manage the interface extension line, simplifying user operation and improving convenience of using the television interface.

Realization, functional features and advantages of the present application will be further explained in conjunction with embodiments and with references to the accompanying drawings.

DETAILED DESCRIPTION OF THE EMBODIMENTS

It should be understood that the specific embodiments described here are intended only to explain the application and are not intended to limit it.

A solution of the embodiments of the application is that: a television is provided, the television includes a display body and an interface extension apparatus, the display body includes a shell and a main board, the main board is provided with a first interface, the main board is installed in the shell, the shell is provided with a channel opening, the interface extension apparatus is installed in the shell, the interface extension apparatus includes a driving module and an interface extension line, the interface extension line includes a data line and a second interface, one end of the data line is connected with the first interface, and the other end of the data line is connected with the second interface. The driving module is in connection with the data line in a transmission way. The driving module is configured for driving one end of the interface extension line provided with the second interface to extend out of the shell through the channel opening, and driving the interface extension line extending out of the shell to be retracted to inside of the shell through the channel opening.

In the related art, an interface of a television is generally arranged on a back of the television shell. The back of the television shell is mostly arranged close to a wall, the space is small, so it is inconvenient for a hand to reach and plug-in an equipment by hand. Many large and heavy equipment needs external wires to realize connection between the equipment and the television. However, this requires users to configure corresponding wires separately, and the wires need extra storage space and management, which leads to inconvenience for the users to use the television interface.

The application provides the solution, aiming at simplifying the operation of the user and improving the convenience for the user to use the television interface.

The application provides a television 1. The television 1 may be any display apparatus such as a liquid crystal television, an organic light emitting diode television, etc.

Figure 1:
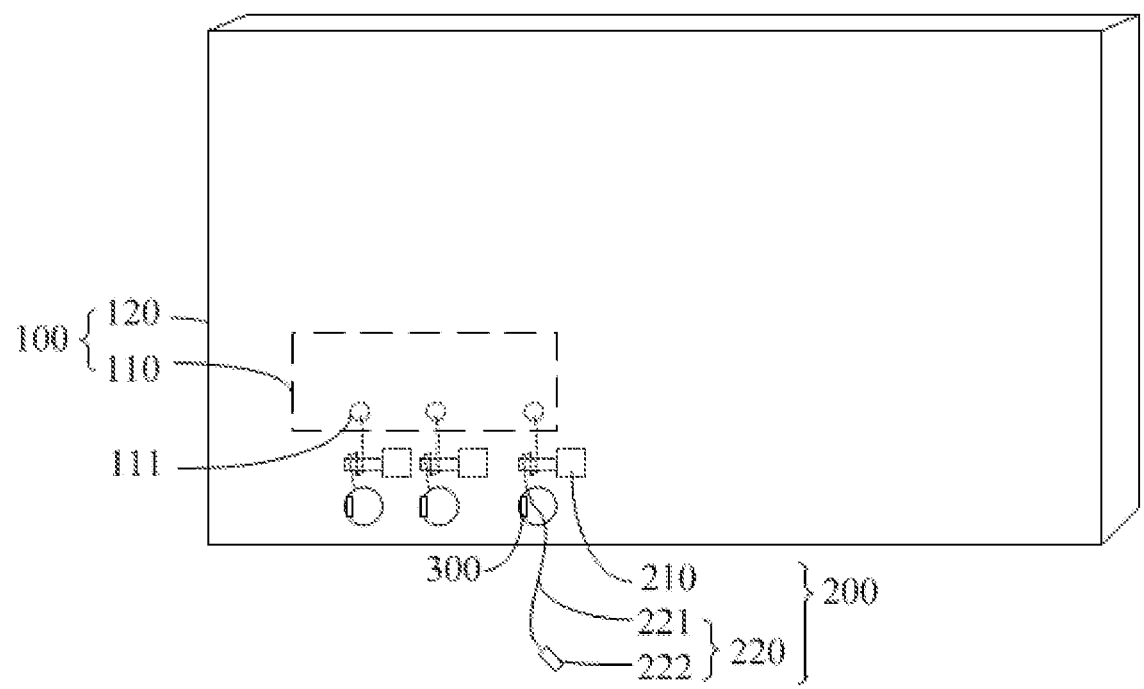
FIG. 1 is a schematic diagram of a structure of an embodiment of a television of the present application.

In an embodiment referring to FIG. 1, the television 1 includes a display body 100 and an interface extension apparatus 200.

The display body 100 includes a main board 110 and a shell 120, the main board 110 is mounted in the shell 120, the main board 110 includes a first interface 111, and the shell 120 includes a channel opening 121. The main board 110 refers to a control circuit system related to an operation of the television 1. The first interface 111 refers to a junction point on the main board 110 for transmitting data with the outside. The channel opening 121 is a channel for communicating the inside and outside of the shell 120. There may be only one first interface 111 or a plurality of first interfaces 111. When there are a plurality of first interfaces 111, the plurality of first interfaces 111 may be of the same types or of different types.

Further the display body 100 also includes components related to television display such as a display panel (not shown), a back light apparatus (not shown) and the like. The shell 120 includes an avoidance opening, and the display panel (not shown) is located in the shell 120 and one panel surface is fitted to the avoidance opening to provide a display image for a user. The back light apparatus (not shown) is disposed in the shell 120 and is disposed close to another panel surface of the display panel (not shown) located in the shell 120. The main board 110 is connected to the display panel (not shown) and the back light apparatus (not shown) to control functions such as display of the television 1.

The interface extension apparatus 200 is mounted within the shell 120 and includes a driving module 210 and an interface extension line 220. The interface extension line 220 includes a data line 221 and a second interface 222. One end of the data line 221 is connected to the first interface 111 and the second interface 222 is connected with the other end of the data line 221. The second interface 222 is a same type of data interface as the first interface 111 and the second interface 222 may include male and/or female headers of the same type of data interface. The first interface 111, the data line 221, and the second interface 222 constitute a data transmission channel between the main board 110 and an external apparatus outside of the television 1.

The driving module 210 is connection with the data line 221 in a transmission way. The driving module 210 is configured for driving one end of the interface extension line 220 provided with the second interface 222 to extend out of the shell 120 through a channel opening 121, and driving the interface extension line 220 out of the shell 120 to be retracted into the shell 120 through the channel opening 121. For convenience of user control, the driving module 210 is specifically a driving module 210 that operates through an electronically controlled trigger such as a motor. The data line 221 is wound directly or indirectly on an output shaft of the motor. The rotation of the output shaft drives the data line 221 connected to the motor to increase or decrease a length wound on the output shaft. A track through which the data line 221 passes may be provided inside the shell 120. When the motor rotates forward, the output shaft drives the interface extension line 220 to move along the track, and the second interface 222 and the data line 221 connected to the second interface are partially or completely extended out of the shell 120. When the motor is reversed, the output shaft drives the interface extension line 220 to move along the track, so that the data line 221 and the second interface 222 out of the shell 120 are retracted into the shell 120. The state in which the interface extension line 220 and the channel opening 121 are retracted to the inside of the shell 120 may specifically include that both the data line 221 and the second interface 222 are accommodated in the shell 120, or all the data lines 221 are accommodated in the shell 120, and the second interface 222 is penetrated through the channel opening 121. In other embodiments, the driving module 210 may also be a driving module 210 operated by a human hand through a mechanical trigger (e.g., a gear with a rocker disposed outside the shell 120 for user manipulation).

A television 1 is provided by the embodiment of the application. The Television 1 includes a display body 100 and an interface extension apparatus 200. The display body 100 includes a shell 120 and a main board 110. The main board 110 includes a first interface 111, the main board 110 is installed in the shell 120, the shell 120 is provided with a channel opening 121, the interface extension apparatus 200 is installed in the shell 120, the interface extension apparatus 200 includes a driving module 210 and an interface extension line 220, the interface extension line 220 includes a data line 221 and a second interface 222, one end of the data line 221 is connected with the first interface 111, and the other end of the data line 221 is connected with the second interface 222. The driving module 210 is connection with the data line 221 in a transmission way. The driving module 210 is configured for driving one end of the interface extension line 220 provided with the second interface 222 to extend out of the Shell 120 through the channel opening 121, and driving the interface extension line 220 out of the shell 120 to be retracted into the shell 120 through the channel opening 121. Since the television 1 includes the interface extension line 220, when the user needs to use the interface of the television 1, the interface is no longer fixed to the shell 120 of the television 1. Instead, the second interface 222 is added and connected to an external apparatus through a data line 221. Users do not need to put their hands into a narrow space to plug in the apparatus. The driving module 210 is directly controlled manually or by a control command to drive one end of the interface extension line 220 provided with the second interface 222 to extend out of the shell 120, so that the apparatus is connected to the second interface 222. When the user is not using the television interface or not wanting the second interface 220 to be exposed outside, the user can control the driving module 210 to drive the interface extension line 220 to be retracted into the shell 120, therefore facilitating the user to store and manage the interface extension line 220, simplifying the user's operation and improving the convenience of the user in using the interface of television 1.

Further, the main board 110 has a plurality of different types of first interfaces 111. A number of the interface extension lines 220 and a number of the driving modules 210 are the same as a number of the first interfaces 111. The interface extension lines 220 are connected to the first interface 111 in one-to-one correspondence, the driving modules 210 are arranged in one-to-one correspondence with the interface extension lines 220, and a type of the second interface 222 is the same as a type of the first interface 111 to which the second interface 222 is connected. Types here are specifically defined according to different communication protocols. For example, a plurality of different types of first interfaces 111 may specifically include an HDMI interface, a USB interface, an AV interface and the like. A first interface 111 of one type has an interface extension line 220 connected thereto, the interface extension line 220 includes a second interface 222 of the same type as the first interface 111, and the data line 221 of each interface extension line 220 is connected with a driving module 210 in a transmission way. In the above way, the main board 110 may be provided with a plurality of types of first interfaces 111 to implement diversified functions of the television 1, each type of first interface 111 may be individually connected to an external apparatus via an interface extension line 220 connected thereto based on the above arrangement. Each of the interface extension line 220 can be independently driven by the corresponding driving module 210, therefore realizing that a user can select an interface extension line 220 required by the user to extend out of the shell 120 according to a demand, and realizing a multifunctional interface of the television 1 and avoiding an interface that the user does not need to use to be exposed outside the television 1 and affect beauty of the television 1.

Further, the television 1 further includes a line length detection module 300, which is configured for detecting a first length information of the interface extension line 220 located outside the shell 120 and/or a second length information of the interface extension line 220 located inside the shell 120. The display body 100 is further used for displaying the first length information and/or the second length information. For example, the line length detection module 300 may specifically include a timer and an encoder disposed opposite to a motor output shaft, the encoder may detect the rotational speed of the motor output shaft, the timer starts from zero when a rotational speed detected by the encoder is not zero, and the timer stops when the rotational speed detected by the encoder changes from not zero to zero. A time length timed by a timer and a rotational speed detected by an encoder within the time length are obtained, and the first length information and/or the second length information are calculated according to the rotational speed and the time length. In other embodiments, the line length detection module 300 may further be arranged at the channel opening 121 or another position to detect motion information of an object passing through the channel opening 121, and determine the first length information and/or the second length information according to the motion information. A driving process of the driving module 210 may be controlled based on the detected first length information and/or the second length information. In addition, the display body 100 can be controlled to display the first length information and/or the second length information, so that the user can obtain a current operation state of the interface extension apparatus 200 and implement further control based on his actual requirements.

In addition, the present application further provides a control apparatus 400, which can be applied to control operation of the driving module 210. The control apparatus 400 is arranged inside the shell 120 and installed on the main board 110; in addition, the control apparatus 400 may be provided outside the television 1 independently.

Figure 2:
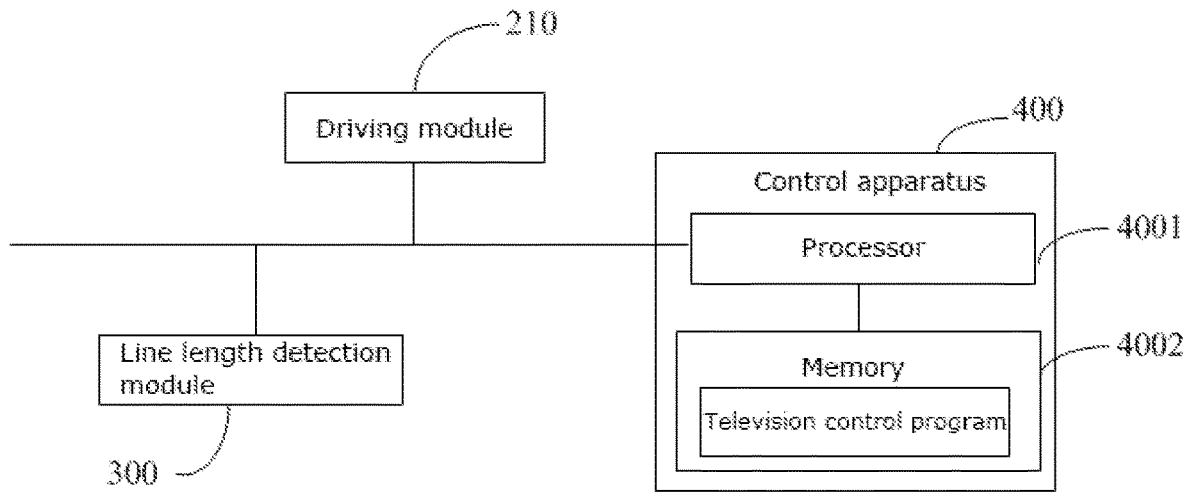
FIG. 2 is a schematic diagram of a hardware structure related to operation of a control apparatus and a television of the embodiments.

In an embodiment of the present application referring to FIG. 2, the control apparatus 400 includes a processor 4001 such as a CPU, a memory 4002 and the like. The memory 4002 may be a high-speed RAM memory or a non-volatile memory such as a disk memory. The memory 4002 may optionally be a storage apparatus independent of the processor 4001 described above.

The processor 4001 is specifically connected to the driving module 210 described above to control the operation of the driving module 210. The processor 4001 is also specifically connected with the line length detection module 300 to acquire detected data of the line length detection module 300.

Those skilled in the art will appreciate that the apparatus configuration shown in FIG. 1 does not constitute a limitation of the apparatus and may include more or fewer components than illustrated, or a combination of certain components, or different component arrangements.

As shown in FIG. 1 a television control program may be included in the memory 4002 as a readable storage medium. In the apparatus shown in FIG. 1 the processor 4001 may be used to invoke the television control program stored in the memory 4002 and to perform the related step operations of the television control method in the following embodiments.

Based on the television, the application further provides a television control method.

Figure 3:
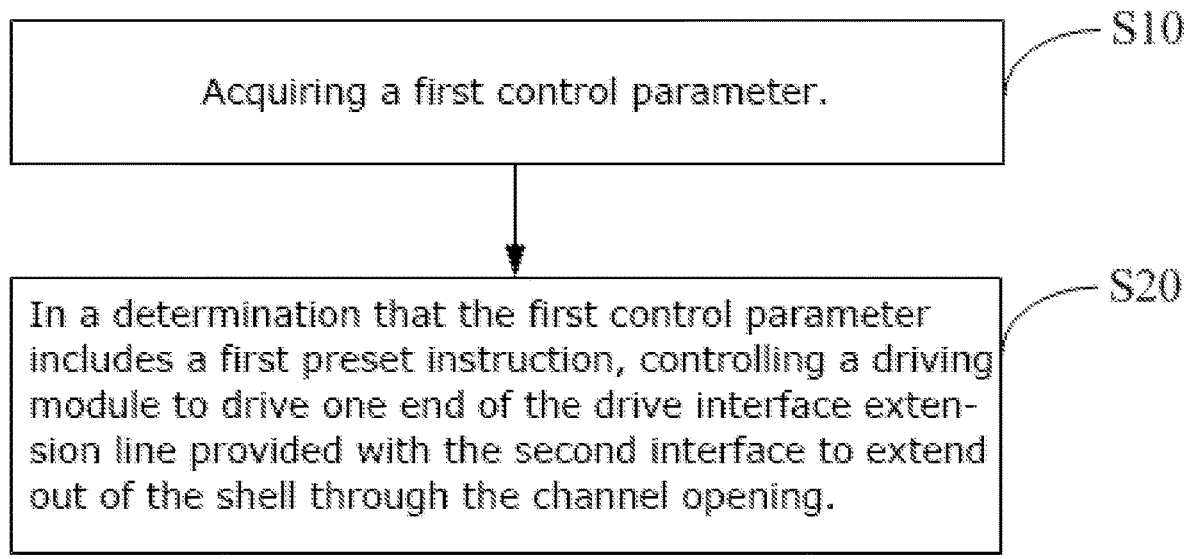
FIG. 3 is a schematic flow diagram of a first embodiment of a television control method of the present application.

According to FIG. 3, a first embodiment of the television control method of the present application is presented. In the first embodiment, the television control method includes:

Step S10, acquiring a first control parameter.

Users send out control instructions to televisions by remote control, voice, mobile phones or the like. The control instructions sent by the users are monitored in real time to obtain the first control parameter.

Step S20, in a determination that the first control parameter includes a first preset instruction, controlling a driving module to drive one end of the drive interface extension line provided with the second interface to extend out of the shell through the channel opening.

The first preset instruction specifically refers to an instruction of extending the interface extension line. When it is recognized that the first control parameter includes the first preset instruction, based on the first preset instruction, a response level signal or PWM signal is generated and sent to the driving module, so that the driving module drives the interface extension line based on the received signal, and one end of the interface extension line provided with the second interface extends out of the shell through a channel opening on the shell.

In the embodiment, the user can make the required interface extension line extend to outside of the shell only by issuing an electric control command, without needing to reach into a small space. The apparatus is connected to the extended out second interface, thereby simplifying user operation and improving convenience for the user to use the television interface.

Figure 4:
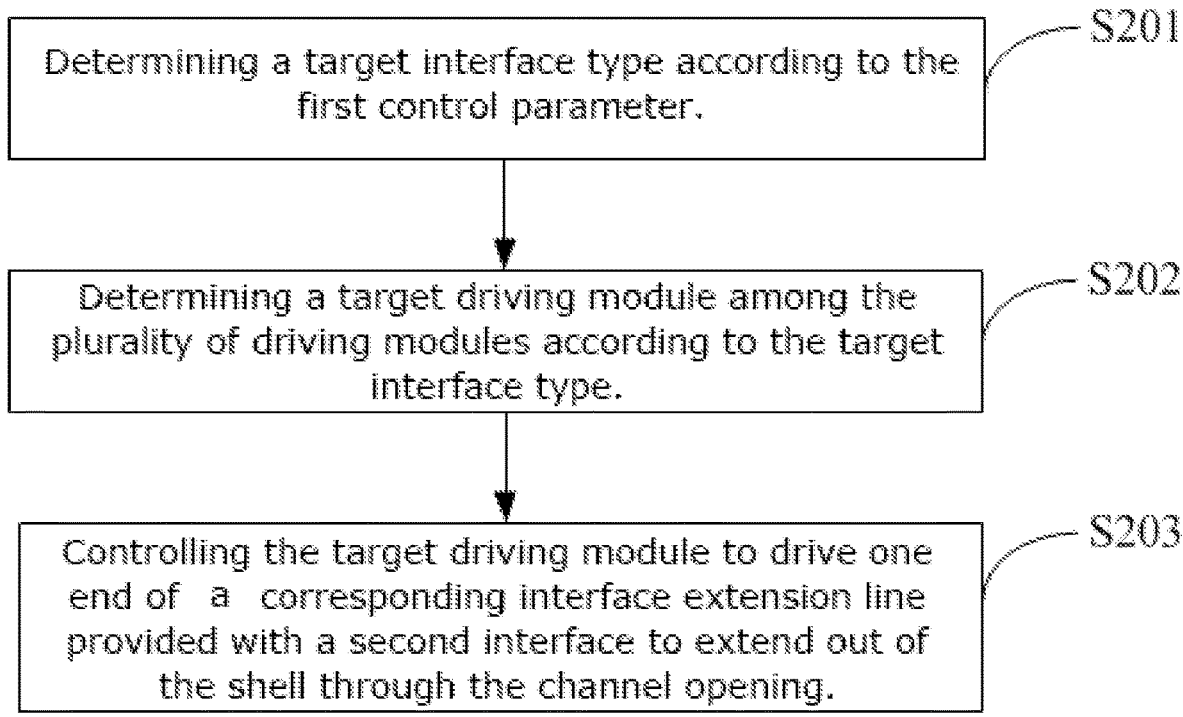
FIG. 4 is a schematic flow diagram of a second embodiment of the television control method of the present application.

Further, based on the above-mentioned first embodiment, a second embodiment of the present application is proposed. In a second embodiment, according to FIG. 4, when the television includes a first interface, an interface extension line and a driving module, and when the first control parameter includes a first preset instruction, the control driving module drives the end of the interface extension line provided with the second interface to extend out of the shell, the control driving module also includes:

Step S201, determining a target interface type according to the first control parameter.

When the television is provided with multiple types of interfaces, the user can select the required interface type in the control instruction sent by the television, and identify an identification of the interface type in the first control parameter corresponding to the control instruction sent by the television, so as to determine the target interface type required by the user.

Step S202, determining a target driving module among the plurality of driving modules according to the target interface type.

A driving module corresponding to the first interface with a same type as the target interface is used as the target driving module.

In particular, when there are a plurality of first interfaces consistent with the target interface type, one or all of the corresponding driving modules can be selected as the target driving modules.

The control driving module driving the end of the interface extension line provided with the second interface to extend out of the shell through the channel opening includes the following steps.

Step S203, controlling the target driving module to drive one end of a corresponding interface extension line provided with a second interface to extend out of the shell through the channel opening.

In a second embodiment, with the above way, the interface extension line corresponding to a target interface type required by the user extends out of the shell of the television. The interface extension line corresponding to an interface type that the user does not need is kept in the shell of the television, thereby ensuring that the user can obtain the interface needed by himself without identification, and avoiding the redundant lines being exposed outside the television and affecting the beauty of the television.

Figure 5:
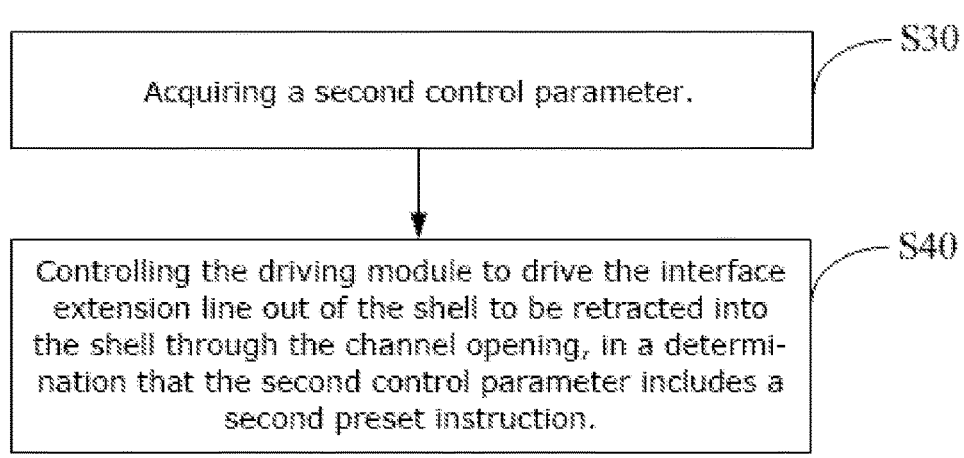
FIG. 5 is a schematic flow diagram of a third embodiment of the television control method of the present application.

Further, based on the first embodiment or the second embodiment, a third embodiment of the television control method of the present application is proposed. In the third embodiment, according to the FIG. 5, following Step S20, the method further includes:

Step S30, acquiring a second control parameter.

Users send out control instructions to televisions by remote control, voice, mobile phones or the like. The control instructions sent by the users are monitored in real time to obtain the second control parameter.

Step S40, controlling the driving module to drive the interface extension line out of the shell to be retracted into the shell through the channel opening, in a determination that the second control parameter includes a second preset instruction.

The second preset instruction specifically refers to an instruction to retract the interface extension line; a response level signal or PWM signal is generated and sent to the driving module, in a determination that the second control parameter includes a second preset instruction, based on the second preset instruction, so that the driving module drives the interface extension line based on the received signal, and one end of the interface extension line currently located outside the shell with the second interface is retracted to the inside of the shell through a channel opening on the shell.

In the embodiment, when the user does not need to use the interface extension line, the user can control the interface extension line located outside the shell to be retracted to the inside of the shell by issuing an instruction, so as to improve the neatness and aesthetics of the television.

Figure 6:
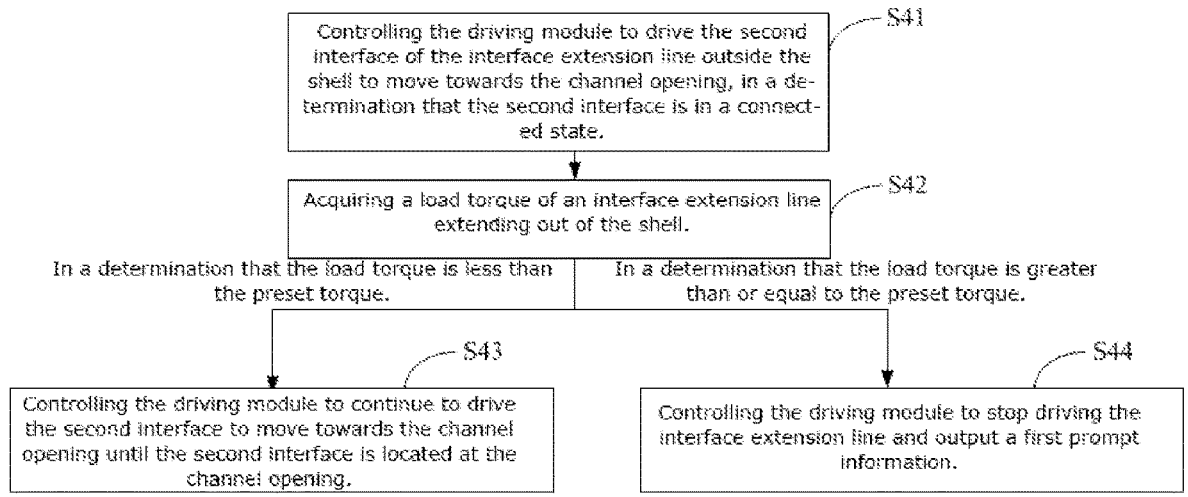
FIG. 6 is a schematic flow diagram of a fourth embodiment of the television control method of the present application.

Further, based on the third embodiment, a fourth embodiment of the television control method of the present application is proposed. In the fourth embodiment, according to FIG. 6, in step S40, the step of controlling the driving module to drive the interface extension line out of the shell to be retracted into the shell through the channel opening includes:

Step S41, controlling the driving module to drive the second interface of the interface extension line outside the shell to move towards the channel opening, in a determination that the second interface is in a connected state.

The connected state refers to the state in which the second interface is connected with an apparatus; when the second interface is not connected with an apparatus, the second interface is not connected.

Step S42, acquiring a load torque of an interface extension line extending out of the shell, acquiring a current working current of the driving motor and calculating the load torque according to the obtained current.

Executing Step S43, in a determination that the load torque is less than the preset torque; and/or executing Step S44, in a determination that the load torque is greater than or equal to the preset torque.

The preset torque can be determined according to a maximum torque of the driving module, a bearing capacity of structural components of the television related to an interface extension apparatus, etc.; the load torque is acquired during a movement of the second interface towards the channel opening.

Step S43, controlling the driving module to continue to drive the second interface to move towards the channel opening until the second interface is located at the channel opening.

Step S44, controlling the driving module to stop driving the interface extension line and output a first prompt information.

The first prompt message can be displayed, a sound, a light and other ways to send out.

In this embodiment, by the above way, in a determination that the second interface is connected with the apparatus, a lighter apparatus can be inserted on the television following the retraction of the interface extension line, thereby avoiding the exposure of the interface extension line and eliminating the need for a user to reach out to the back of the television to find the interface, therefore improving the convenience of the user to use the television interface and ensuring the beauty of the television. In a determination that the apparatus is heavy, the interface extension line is stop retracted, so as to avoid damaging the interface extension apparatus or even damaging the television in the process of retracting the interface extension line.

In particular, when the second interface is not in a state of connection, the driving module can be directly controlled to drive the interface extension line located outside the shell to be retracted to the inside of the shell through the channel opening.

Figure 7:
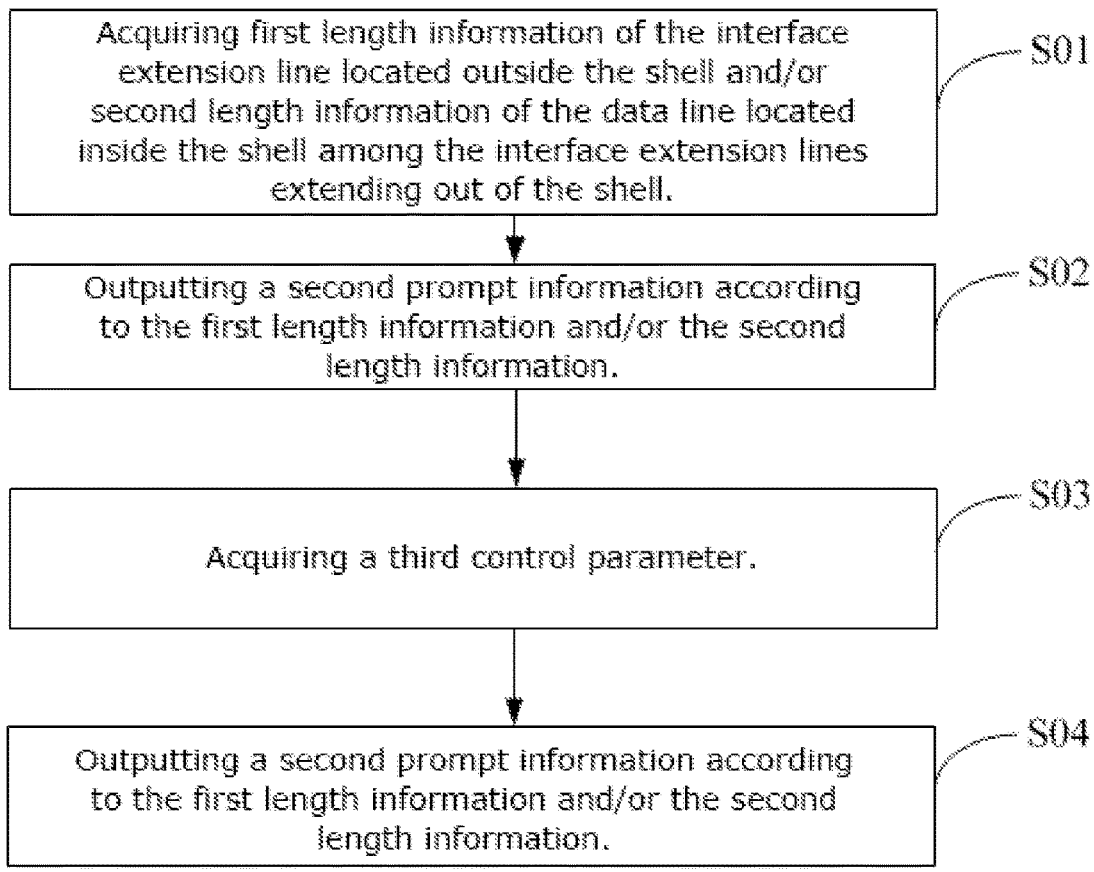
FIG. 7 is a schematic flow diagram of a fifth embodiment of the television control method of the present application.

Further, based on any of the above embodiments, a fifth embodiment of the television control method of the present application is proposed. In the fifth embodiment, according to FIG. 7, when the step of controlling the driving module to drive the interface extension line to extend out of the shell through the channel opening is executed, the television control method further includes:

Step S01, acquiring first length information of the interface extension line located outside the shell and/or second length information of the data line located inside the shell among the interface extension lines extending out of the shell.

Step S02, outputting a second prompt information according to the first length information and/or the second length information.

The second prompt information may be text or sound information. Specifically, the first length information and/or the second length information can be displayed on the television in real time.

In this embodiment, a user can know a situation that the current interface extension line extends out of the shell through the second prompt information, therefore, improving the convenience of the user to use the interface.

Specifically, in the fourth embodiment, after Step S02, the method further includes:

Step S03, acquiring a third control parameter.

After receiving the second prompt message, the user can issue control instructions to the television through remote control, voice, mobile phone or another way. The control instructions sent by the user are monitored in real time to obtain the third control parameter.

Step S04, outputting a second prompt information according to the first length information and/or the second length information.

The third preset instruction specifically refers to the instruction to stop extending the extension line of the current interface.

In the embodiment, the length of the extended interface extension line can be determined by the user based on an actual demand of the user, so as to avoid the influence of a short interface extension line on the usage and the influence of a long interface extension line on the beauty of the television, and to improve an intelligent degree of using the television interface by the user. In particular, the second prompt information is sent out in real time, so that the user can intuitively know an extending situation of the current interface extension line, and control a pause of extending of the interface extension line according to a demand, therefore, further improving the convenience of the user to use the interface.

Figure 8:
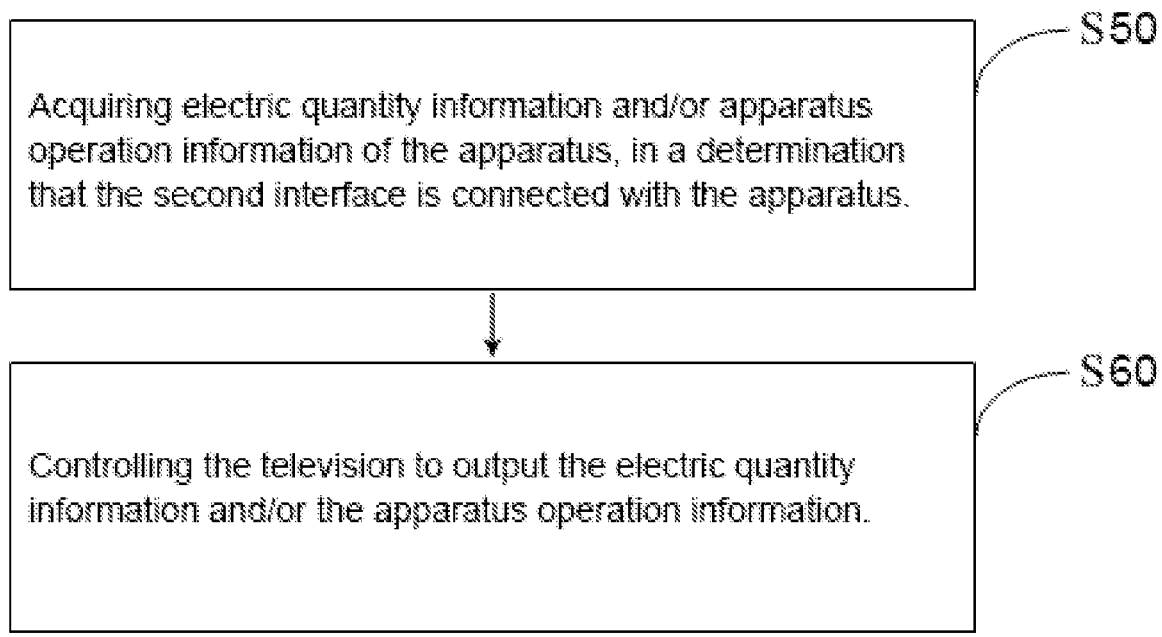
FIG. 8 is a schematic flow diagram of a sixth embodiment of the television control method of the present application.

Further, based on any of the above-mentioned embodiments, a sixth embodiment of the television control method of the present application is proposed. In the sixth embodiment, as shown in FIG. 8, after Step S20, the method further includes: Step S50, acquiring electric quantity information and/or apparatus operation information of the apparatus, in a determination that the second interface is connected with the apparatus; Step S60, controlling the television to output the electric quantity information and/or the apparatus operation information. In particular, the television is controlled to output electric quantity information and/or apparatus operation information by means of display, sound or the like. The apparatus operation information specifically includes messages received by the apparatus, etc.

Figure 9:
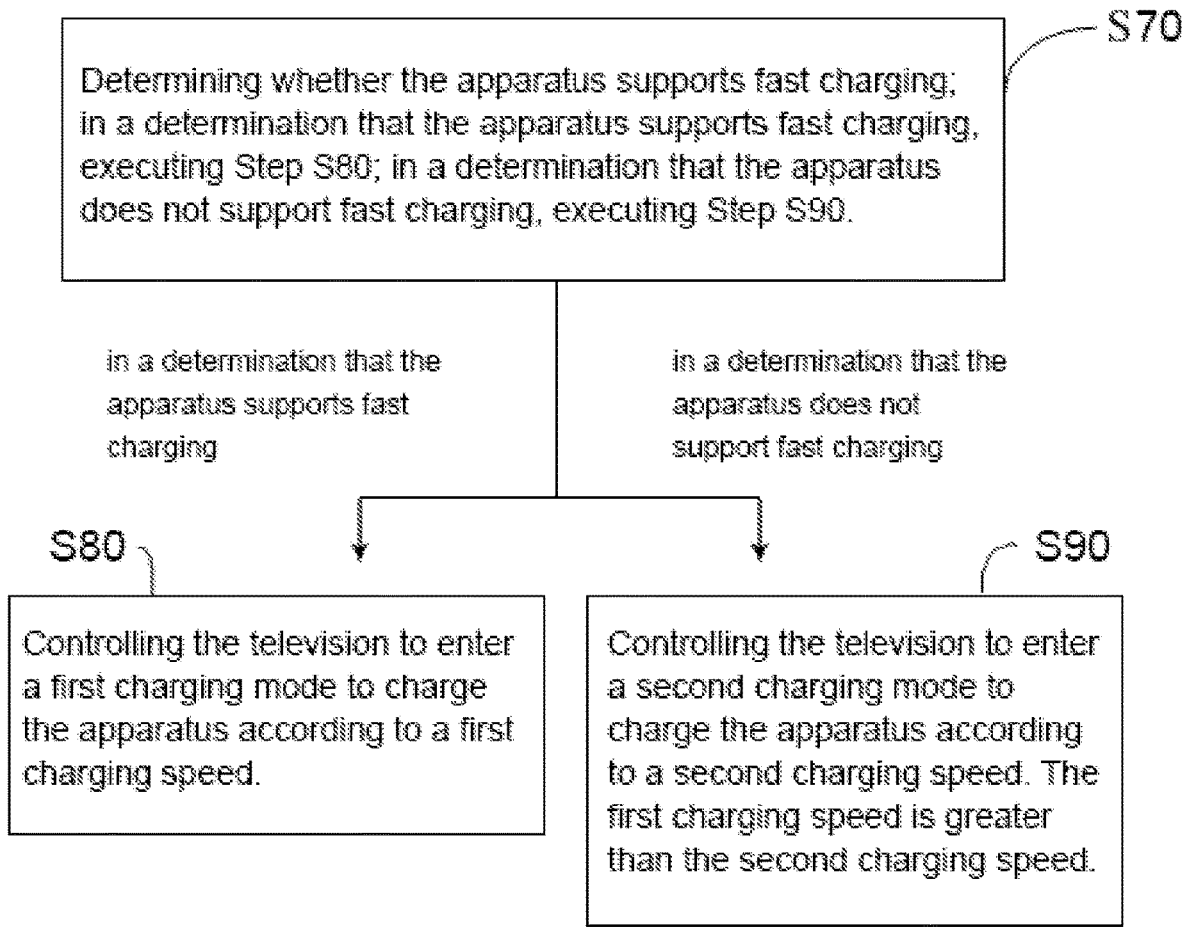
FIG. 9 is a schematic flow diagram of the sixth embodiment of the television control method of the present application.

In addition, as shown in FIG. 9, after Step S20, the method further includes Step S70, determining whether the apparatus supports fast charging; in a determination that the apparatus supports fast charging, executing Step S80; in a determination that the apparatus does not support fast charging, executing Step S90.

Step S80, controlling the television to enter a first charging mode to charge the apparatus according to a first charging speed.

Step S90, controlling the television to enter a second charging mode to charge the apparatus according to a second charging speed. The first charging speed is greater than the second charging speed.

In the embodiment, after the apparatus is connected to the television, the user may obtain electric quantity information and/or operation information of the apparatus from the television, so that the user can pay attention to the mobile phone dynamics in real time when watching the television. In addition, the television can automatically charge the connected apparatus, and select a best way to charge it according to a supported charging mode.

In addition, the embodiment of the application further provides a readable storage medium, the television control program is stored on the readable storage medium, when the television control program is executed by a processor, relevant steps of any embodiment of the television control method are realized.

It should be noted that in this article, the terms "include", "comprise", or any other variant thereof is intended to cover non-exclusive inclusion so that a process, method, article or system that includes a set of elements includes not only those elements but also other elements that are not explicitly listed, or also elements inherent to such a process, method, article or system. In the absence of more restrictions, element defined by the statement "include a . . . " does not preclude the existence of another identical element in the process, method, article or system in which the element is included.

Above serial numbers of the embodiments of the application are for description only and do not represent advantages and disadvantages of the embodiments.

From the above description of the embodiments, it will be clear to those skilled in the art that the method of the above embodiments can be implemented by means of software with a necessary common hardware platform, and of course also by means of hardware, but in many cases the former is a preferred embodiment. Based on this understanding, the technical solution of the present application may be embodied in the form of a software product, which is stored in a storage medium as described above, in essence or in a part that contributes to the prior art (such as ROM/RAM Disk, CD-ROM) includes instructions for causing a terminal apparatus (It can be mobile phone, computer, server, air conditioner, or network apparatus, etc.) to perform the methods described in various embodiments of the application.

The above are only preferred embodiments of the present application and are not therefore limiting the patent scope of the present application. Any equivalent structure or equivalent process transformation made by using the contents of the present specification and drawings, or directly or indirectly applied to other related technical fields, are similarly included in the patent protection scope of the present application.

What is claimed is:

1. A television with an interface extension line, comprising:
a display body comprising a shell and a main board, wherein the main board is provided with a first interface, the main board is installed in the shell, and the shell is provided with a channel opening; and
an interface extension apparatus installed in the shell, comprising a driving module and an interface extension line, wherein the interface extension line comprises a data line and a second interface, one end of the data line is connected with the first interface, and another end of the data line is connected with the second interface;
a line length detection module configured for detecting a first length information of the interface extension line located outside the shell and a second length information of the interface extension line located inside the shell; and
wherein the display body is also configured for displaying the first length information and the second length information;
the driving module is connected with the data line, the driving module is configured for driving one end of the interface extension line provided with the second interface to protrude out of the shell through the channel opening, and driving the interface extension line out of the shell to be retracted into the shell through the channel opening.

2. The television according to claim 1, wherein the main board has a plurality of different types of first interfaces, a number of the interface extension lines and a number of the driving modules are the same as a number of the first interfaces, the interface extension lines are connected with the first interfaces in one-to-one correspondence, the driving modules are arranged in one-to-one correspondence with the interface extension lines, and a type of each second interface is the same as a type of a first interface connected with the second interface.

3. A television control method, applied on a television with an interface extension line, the television comprising:
a display body comprising a shell and a main board, wherein the main board is provided with a first interface, the main board is installed in the shell, and the shell is provided with a channel opening; and
an interface extension apparatus installed in the shell, comprising a driving module and an interface extension line, wherein the interface extension line comprises a data line and a second interface, one end of the data line is connected with the first interface, and another end of the data line is connected with the second interface;
wherein the driving module is connected with the data line, the driving module is configured for driving one end of the interface extension line provided with the second interface to protrude out of the shell through the channel opening, and driving the interface extension line out of the shell to be retracted into the shell through the channel opening;
the method comprises:
acquiring a first control parameter; and
controlling the driving module to drive one end of the interface extension line provided with the second interface to extend out of the shell through the channel opening, in a determination that the first control parameter comprises a first preset instruction;
acquiring a second control parameter; and
controlling the driving module to drive the interface extension line out of the shell to be retracted into the shell through the channel opening, in a determination that the second control parameter comprises a second preset instruction;
wherein the step of controlling the driving module to drive the interface extension line out of the shell to be retracted into the shell through the channel opening comprises:
controlling the driving module to drive the second interface of the interface extension line outside the shell to move towards the channel opening, in a determination that the second interface is in a connected state;
acquiring a load torque of the interface extension line out of the outer part of the shell;
controlling the driving module to continue to drive the second interface to move towards the channel opening until the second interface is located at the channel opening, in a determination that the load torque is less than a preset torque; or
controlling the driving module to stop driving the interface extension line and output a first prompt information, in a determination that the load torque is greater than or equal to the preset torque.

4. The television control method according to claim 3, wherein before the step of controlling the driving module to drive one end of the interface extension line provided with the second interface to extend out of the shell through the channel opening, in a determination that the first control parameter comprises the first preset instruction, the television control method further comprises:
determining a target interface type according to the first control parameter; and
determining a target driving module among the driving modules according to the target interface type;
the step of controlling the driving module to drive one end of the interface extension line provided with the second interface to extend out of the shell comprises the following steps:
controlling the target driving module to drive one end of a corresponding interface extension line provided with the second interface to extend out of the shell through the channel opening.

5. The television control method according to claim 3, wherein when the step of controlling the driving module to drive the interface extension line to extend out of the shell through the channel opening is executing, the television control method further comprises:
acquiring first length information of the interface extension line located outside the shell and/or second length information of the data line located inside the shell among interface extension lines extending out of the shell; and
outputting a second prompt information according to the first length information and the second length information.

6. The television control method according to claim 5, wherein after the step of outputting the second prompt information according to the first length information and/or the second length information, the television control method further comprises:
acquiring a third control parameter; and controlling the driving module to stop driving the interface extension line, in a determination that the third control parameter comprises a third preset instruction.

7. The television control method according to claim 3, wherein after the step of controlling the driving module to drive one end of the interface extension line provided with the second interface to extend out of the shell through the channel opening, the television control method further comprises:
   acquiring electric quantity information and apparatus operation information of the apparatus, in a determination that the second interface is connected with an apparatus;
   controlling the television to output the electric quantity information and the apparatus operation information; and
   determining whether the apparatus supports fast charging;
   controlling the television to enter a first charging mode to charge the apparatus according to a first charging speed, in a determination that the apparatus supports fast charging; or
   controlling the television to enter a second charging mode to charge the apparatus according to a second charging speed, in a determination that the apparatus does not support fast charging;
   wherein the first charging speed is faster than the second charging speed.

8. A control apparatus, applied on a television with an interface extension line, the television comprising:
   a display body comprising a shell and a main board, wherein the main board is provided with a first interface, the main board is installed in the shell, and the shell is provided with a channel opening; and
   an interface extension apparatus installed in the shell, comprising a driving module and an interface extension line, wherein the interface extension line comprises a data line and a second interface, one end of the data line is connected with the first interface, and another end of the data line is connected with the second interface;
   wherein the driving module is connected with the data line, the driving module is configured for driving one end of the interface extension line provided with the second interface to protrude out of the shell through the channel opening, and driving the interface extension line out of the shell to be retracted into the shell through the channel opening;
   the control apparatus comprises a memory, a processor, and a television control program stored in the memory and operable on the processor, when the television control program is executed by the processor, following steps of a television control method are realized:
   acquiring a first control parameter; and
   controlling the driving module to drive one end of the interface extension line provided with the second interface to extend out of the shell through the channel opening, in a determination that the first control parameter comprises a first preset instruction;
   acquiring a second control parameter; and
   controlling the driving module to drive the interface extension line out of the shell to be retracted into the shell through the channel opening, in a determination that the second control parameter comprises a second preset instruction;
   wherein the step of controlling the driving module to drive the interface extension line out of the shell to be retracted into the shell through the channel opening comprises:
   controlling the driving module to drive the second interface of the interface extension line outside the shell to move towards the channel opening, in a determination that the second interface is in a connected state;
   acquiring a load torque of the interface extension line out of the outer part of the shell;
   controlling the driving module to continue to drive the second interface to move towards the channel opening until the second interface is located at the channel opening, in a determination that the load torque is less than a preset torque; or
   controlling the driving module to stop driving the interface extension line and output a first prompt information, in a determination that the load torque is greater than or equal to the preset torque.

9. The control apparatus according to claim 8, wherein before the step of controlling the driving module to drive one end of the interface extension line provided with the second interface to extend out of the shell through the channel opening, in a determination that the first control parameter comprises the first preset instruction, the television control method further comprises:
   determining a target interface type according to the first control parameter; and
   determining a target driving module among a plurality of driving modules according to the target interface type;
   the step of controlling the driving module to drive one end of the interface extension line provided with the second interface to extend out of the shell comprises the following steps:
   controlling the target driving module to drive one end of a corresponding interface extension line provided with the second interface to extend out of the shell through the channel opening.

10. The control apparatus according to the claim 8, wherein when the step of controlling the driving module to drive the interface extension line to extend out of the shell through the channel opening is executing, the television control method further comprises:
   acquiring first length information of the interface extension line located outside the shell and/or second length information of the data line located inside the shell among interface extension lines extending out of the shell; and
   outputting a second prompt information according to the first length information and/or the second length information.

11. The control apparatus according to the claim 10, wherein after the step of outputting the second prompt information according to the first length information and/or the second length information, the television control method further comprises:
   acquiring a third control parameter; and
   controlling the driving module to stop driving the interface extension line, in a determination that the third control parameter comprises a third preset instruction.

12. The control apparatus according to the claim 8, wherein after the step of controlling the driving module to drive one end of the interface extension line provided with the second interface to extend out of the shell through the channel opening, the television control method further comprises:
   acquiring electric quantity information and apparatus operation information of the apparatus, in a determination that the second interface is connected with an apparatus;

controlling the television to output the electric quantity information and the apparatus operation information; and determining whether the apparatus supports fast charging;

controlling the television to enter a first charging mode to charge the apparatus according to a first charging speed, in a determination that the apparatus supports fast charging; or controlling the television to enter a second charging mode to charge the apparatus according to a second charging speed, in a determination that the apparatus does not support fast charging;

wherein the first charging speed is faster than the second charging speed.

* * * * *